United States Patent [19]

Cathey et al.

[11] Patent Number: 5,232,549
[45] Date of Patent: Aug. 3, 1993

[54] SPACERS FOR FIELD EMISSION DISPLAY FABRICATED VIA SELF-ALIGNED HIGH ENERGY ABLATION

[75] Inventors: David A. Cathey; Chris C. Yu; Trung T. Doan; Tyler A. Lowrey; J. Brett Rolfson, all of Boise, Iowa

[73] Assignee: Micron Technology, Inc., Boise, Iowa

[21] Appl. No.: 869,348

[22] Filed: Apr. 14, 1992

[51] Int. Cl.[5] .......................... B44C 1/22; B29C 37/00
[52] U.S. Cl. .................................. 456/633; 156/643; 156/655; 156/659.1; 156/668; 313/309; 445/24; 219/121.69
[58] Field of Search ............... 156/629, 633, 643, 645, 156/655, 657, 659.1, 668; 313/309, 351; 445/24, 25; 219/121.68, 121.69

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 3,875,442 | 4/1975 | Wasa et al. | 313/193 |
| 4,292,092 | 9/1981 | Hanak | 148/1.5 |
| 4,749,840 | 6/1988 | Piwexyk | 219/121 |
| 4,874,461 | 10/1989 | Sato et al. | 156/633 |
| 4,892,592 | 1/1990 | Dickson et al. | 136/244 |
| 4,923,421 | 5/1990 | Brodie et al. | 445/24 |
| 4,973,378 | 11/1990 | Lee et al. | 156/633 |

Primary Examiner—William A. Powell
Attorney, Agent, or Firm—Lia M. Pappas

[57] ABSTRACT

Fabrication of spacer supports for use in flat panel displays through a process which involves 1) depositing an insulating material on an electrode plate, 2) optionally, patterning a reflective material superjacent the insulating material, 3) irradiating the electrode plate, and thereby removing the exposed insulating material, 4) optionally, removing the reflective material, and thereby exposing the remaining insulative material which will serve as the spacer supports, after which the plate can be aligned with a complementary electrode plate, and a vacuum formed therebetween.

22 Claims, 4 Drawing Sheets

SPACERS FOR FIELD EMISSION DISPLAY FABRICATED VIA SELF-ALIGNED HIGH ENERGY ABLATION

FIELD OF THE INVENTION

This invention relates to field emission devices, and more particularly to processes for creating the spacer structures which can provide support against the atmospheric pressure on the flat panel display without impairing the resolution of the image.

BACKGROUND OF THE INVENTION

Cathode ray tube (CRT) displays, such as those commonly used in desk-top computer screens, function as a result of a scanning electron beam from an electron gun impinging on phosphors on a relatively distant screen. The electrons increase the energy level of the phosphors. When the phosphors return to their normal energy level, they release photons which are transmitted through the glass screen of the display to the viewer.

Flat panel displays seek to combine the cathodoluminescent-phosphor technology of CRTs with integrated circuit technology to create thin, high resolution displays wherein each pixel is activated by its own electron emitter. This type of display technology is becoming increasingly important in appliances requiring lightweight portable screens.

It is important in flat panel displays of the field emission cathode type that an evacuated cavity be maintained between the cathode electron emitting surface and its corresponding anode display face (also referred to as an anode, cathodoluminescent screen, display screen, faceplate, or display electrode).

There is a relatively high voltage differential (e.g., generally above 200 volts) between the cathode emitting surface (also referred to as base electrode, baseplate, emitter surface, cathode surface) and the display screen. It is important that electrical breakdown between the electron emitting surface and the anode display face be prevented. At the same time, the narrow spacing between the plates is necessary to maintain the desired structural thinness and to obtain high image resolution. The spacing also has to be uniform for consistent image resolution, and brightness, as well as to avoid display distortion, etc. Uneven spacing is much more likely to occur in a field emission cathode, matrix addressed flat vacuum type display than in some other display types because of the high pressure differential that exists between external atmospheric pressure and the pressure within the evacuated chamber between the baseplate and the faceplate. The pressure in the evacuated chamber is typically less than $10^{-6}$ torr.

Small area displays (e.g., those which are approximately 1" diagonal) do not require spacers, since glass having a thickness of approximately 0.040" can support the atmospheric load, but as the display area increases, spacer supports become more important. For example, a screen having a 30" diagonal measurement will have several tonnes of atmospheric force exerted upon it. As a result of this tremendous pressure, spacers will play an essential role in the structure of the large area, light weight, displays.

Spacers are incorporated between the display faceplate and the baseplate upon which the emitter tips are fabricated. The spacers, in conjunction with thin, lightweight, substrates support the atmospheric pressure, allowing the display area to be increased with little or no increase in substrate thickness.

Spacer structures must conform to certain parameters. The supports must 1) be sufficiently non-conductive to prevent electrical breakdown between the cathode array and the anode, in spite of the relatively close interelectrode spacing (which may be on the order of 100 microns), and relatively high interelectrode voltage differential (which may be on the order of 200 or more volts); 2) exhibit mechanical strength such that they exhibit only slow deformation over time to provide the flat panel display with an appreciable useful life; 3) exhibit stability under electron bombardment, since electrons will be generated at each of the pixels; 4) be capable of withstanding "bakeout" temperatures of around 400° C. that are required to create the high vacuum between the faceplate and backplate of the display; and 5) be of small enough size so as to not to visibly interfere with display operation.

Various types of spacers have been developed. A few examples are disclosed in U.S. Pat. Nos. 4,183,125, entitled "Gas Panel Spacer Technology," 4,091,305, entitled "Method of Making an Insulator-support for Luminescent Display Panels and the Like," 4,422,731, entitled "Display Unit with Half-stud, Spacer, Connection Layer and Method of Manufacturing," and 4,451,759, entitled "Flat Viewing Screen with Spacers between Support Plates and Method of Producing Same".

U.S. Pat. No. 4,923,421 entitled, "Method for Providing Polyimide Spacers in a Field Emission Panel Display," discloses the use of spacer supports in field emission displays. In the above mentioned patent, Brodie et al. describe a process wherein spacers are formed by applying a layer of material to one of the plate surfaces, patterning the material, and then removing the material except for the portions which form the spacers.

There are several drawbacks to the spacers and methods described in the above cited patents. One disadvantage is need for the spacer supports to be relatively large, having diameters in the range of 50 microns, in order to render innocuous the small amount of isotropic distortion that inevitably occurs during anisotropic (plasma) etches. In other words, if the spacers are too narrow, they will tend to curve due to undercutting during the etching process which is used to eliminate the material surrounding the spacer.

Those known processes which involve the use of attaching and aligning pre-made spacers to the electrodes are very unreliable, tedious and expensive.

SUMMARY OF THE INVENTION

Depositing a top patterned reflective layer, or a bottom patterned reflective layer, and optionally a highly thermally conductive patterned top or bottom layer, superjacent an insulative material to which a laser is subsequently directed to "ablate" excess material thereby forming self-aligned support structures for a two panel, flat panel display requiring a vacuum between the plates for operation, such as a cold cathode cathodoluminescent display where the spacers or pillars formed serve as a physical support between the plates.

Alternatively, the laser can also be used to "scribe" the excess deposited insulation material away, leaving the spacer support structures. In such a case, the laser can be preprogrammed thus, eliminating the patterning step.

The laser can also be used to ablate holes in a selectively etchable layer, which holes are filled with the spacer material. The excess material can be removed through chemical mechanical polishing, after which the selectively etchable material is removed, thereby exposing the spacer.

BRIEF DESCRIPTION OF THE DRAWINGS

The present invention will be better understood from reading the following description of nonlimitative embodiments, with reference to the attached drawings, wherein below.

It should be emphasized that the drawings of the instant application are not to scale, but are merely schematic representations and are not intended to portray the specific parameters or the structural details of a flat panel display which are well known in the art.

DETAILED DESCRIPTION OF THE INVENTION

Figure 1:
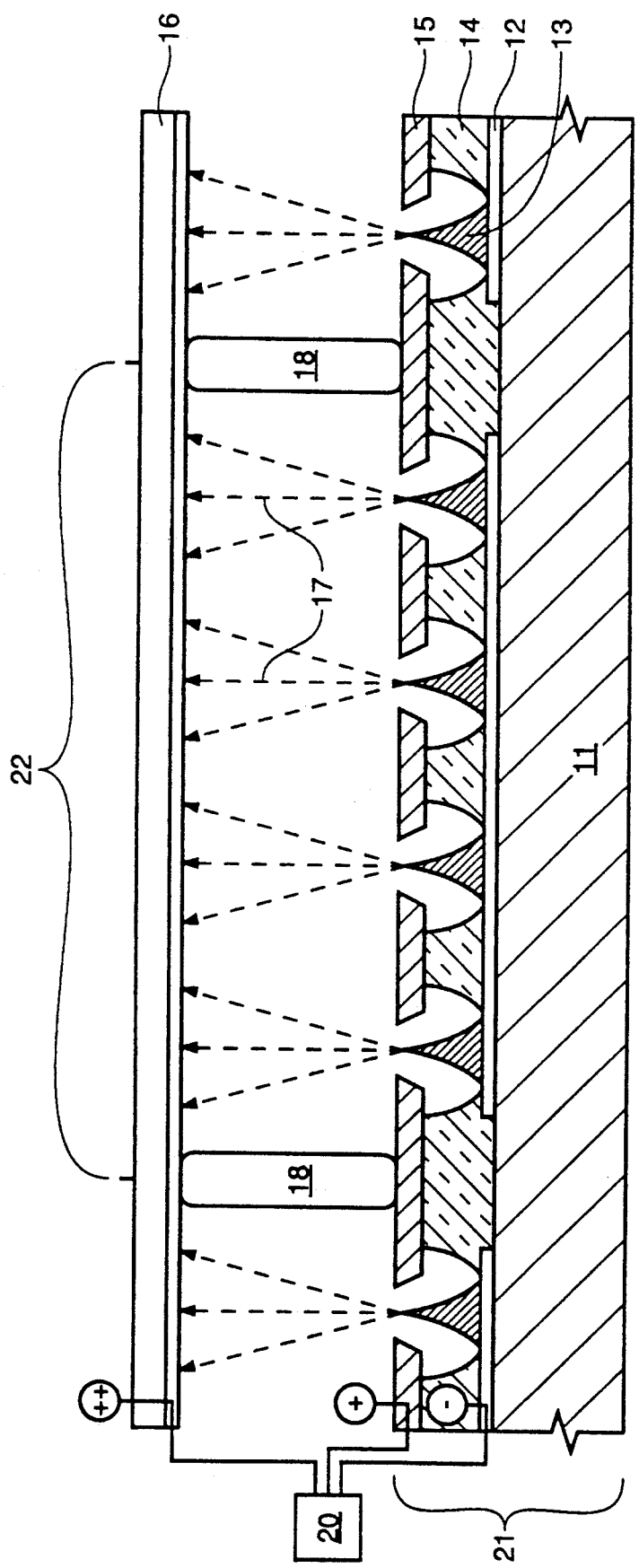
FIG. 1 is a cross-sectional schematic drawing of a pixel of a field emission display consisting of a faceplate with a phosphor screen, vacuum sealed to a base plate which is supported by the spacers formed using the process of the present invention.

Referring to FIG. 1, a pixel 22 of a field emission display employing a cold cathode is depicted. A single crystal silicon layer is the preferable substrate layer 11, onto which a conductive material layer 12, such as doped polycrystalline silicon has been deposited. At the field emission cathode site location, conical micro-cathodes 13 have been constructed superjacent the substrate 11. Surrounding the micro-cathodes 13, is a micro-anode gate structure 15. When a voltage differential, through source 20, is applied between the cathode 13 and the gate 15, a stream of electrons 17 is emitted toward a phosphor coated screen 16. The display screen 16 serves as an anode. The electron emission tips 13 are integral with the single crystal semiconductor substrate 11, and serve as a cathode conductor. Gate 15 serves as a low potential anode or grid structure for the cathode tips 13. An insulating layer 14 is deposited on the on the conductive cathode layer 12. The insulator 14 also has openings at the field emission site locations. Support structures 18, also referred to as spacers are located between the display faceplate 16 and the baseplate 21.

In U.S. Pat. No. 3,8875,442, entitled "Display Panel," Wasa et al. disclose a display panel comprising a transparent gas-tight envelope, two main planar electrodes which are arranged within the gas-tight envelope parallel with each other, and a cathodoluminescent panel. Spindt, et al. disclose field emission cathode structures in U.S. Pat. Nos. 3,665,241; 3,755,704; and 3,812,559.

Figure 2:
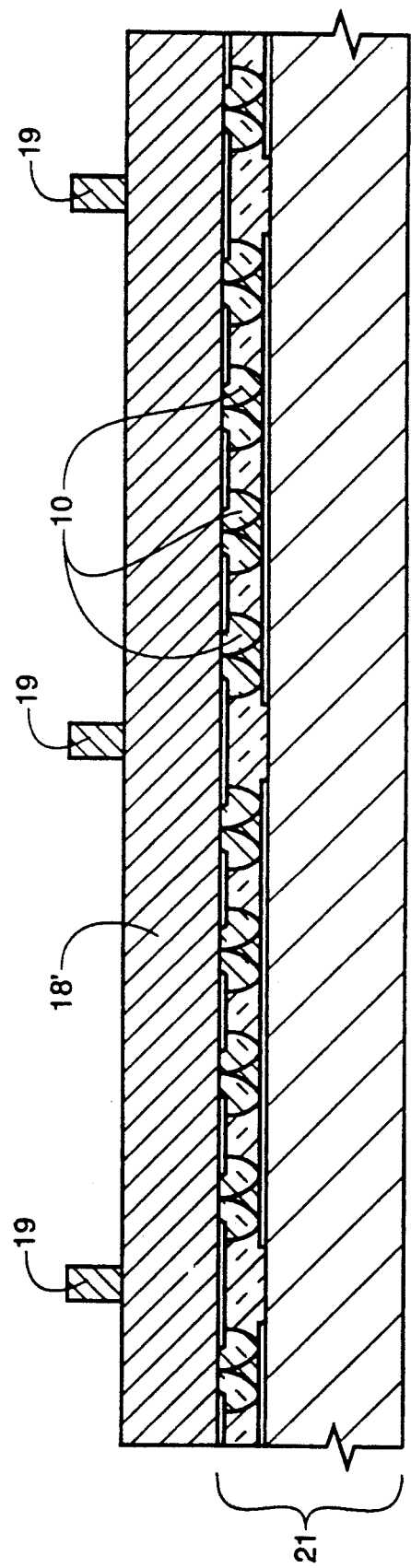
FIG. 2 is a cross-section of the baseplate upon which has been deposited a spacer forming material, on which has been patterned a highly reflective material, according to the method of the present invention.
Figure 3:
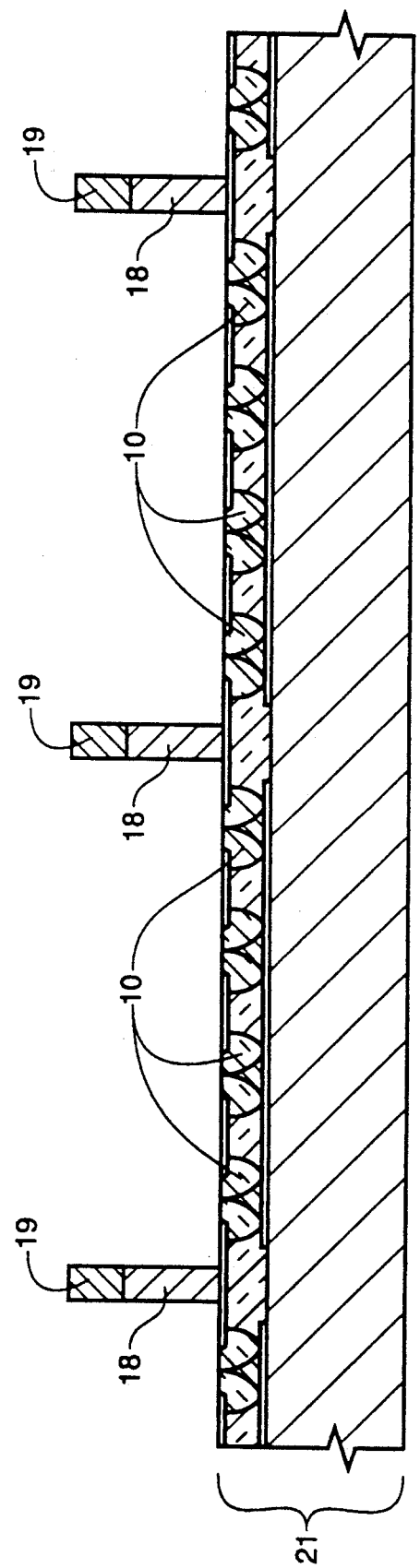
FIG. 3 is a cross-section of the baseplate of FIG. 2, subsequent to irradiation, according to the method of the present invention.
Figure 4:
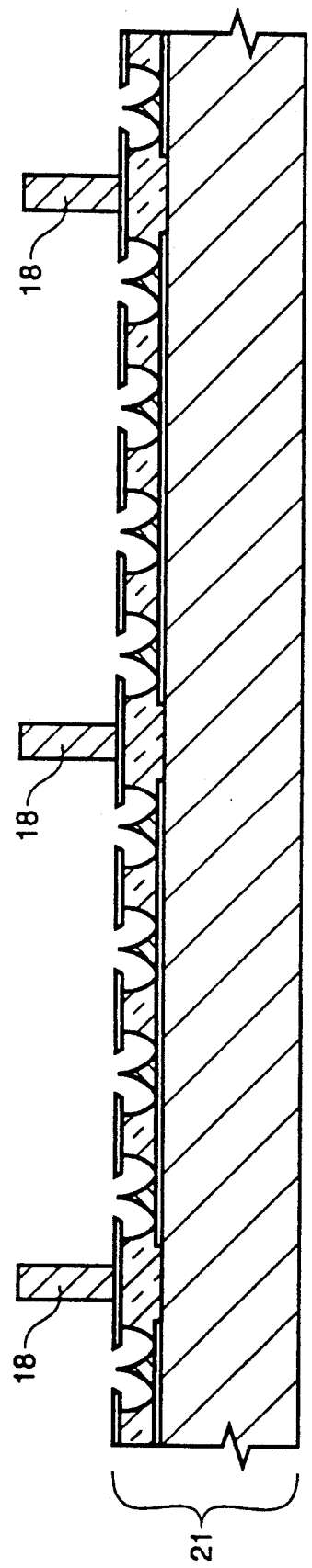
FIG. 4 is a cross-section of the baseplate of FIG. 3, subsequent to the removal of the highly reflective material, according to the method of the present invention.

The invention can best be understood with reference to FIGS. 2-4 of the drawings which depict the initial, intermediate, and final structures produced by a series of manufacturing steps, according to the present invention.

Referring now to FIG. 2. In the preferred embodiment, a suitable insulative layer 18' is deposited on an electrode plate, which electrode plate will ultimately be used to form one of the electrode plates of the flat panel display, preferably the baseplate 21 containing the field emitter array, but it is also possible to deposit the insulative material on the cathodoluminescent screen 16. Of course, the emitter tips 13 will have to be suitably protected with, for example, an oxide coating 10, before the insulative layer 18' can be deposited on the baseplate 21. The oxide coating 10 can later be removed when the emitter tips 13 are sharpened. (18' is being used to refer to the layer of material that will ultimately form the support spacers 18).

Any dielectric material, any insulative material or any chemical polymer material which can be etched or ablated with radiation (as from a laser) can be used for insulative layer 18', but the preferred materials are polyimide, or a variation of polyimide such as kapton, and silicon nitride.

The chemical polymer 18' should be deposited to a depth representing the height of the desired spacers 18. Therefore if the desired spacers 18 are to be 50-1000 microns, then the insulative, chemical polymer layer 18' should be deposited to approximately that depth.

In practice, it may be determined that spot or glob depositions (not shown) of the chemical polymer, such as polyimide may be preferred to the deposition of a blanket layer 18' covering the whole plate 21. The spacer supports 18 occupy only a small area on the array, and it may prove more cost effective to simply remove the material around a specific spot than to irradiate the whole plate. The accuracy of the laser employed will determine the extent to which such spot depositions will be effective.

The next step in the process involves the deposition of a reflective material 19, such as a metal film, for example, aluminum. A highly reflective material is preferable because such a material will reflect the heat and light (i.e. energy) of the applied laser beam, rather than absorb them. It would take a laser power density 10 to 20 times higher than that used for the chemical polymer to ablate the aluminum. Laser power density being defined as the number of photons per second per unit area. For a given power level, power density varies inversely with the square of the radius of the spot. Hence, the chemical polymer 18' will ablate long before the reflective material 19' thereby providing greater control of the process.

The reflective material layer 19 can be applied or deposited by any of the methods well known in the art, for example, sputtering, patterning, definition patterning, shadow masking, blanket deposition, and etc. The preferable depth of the reflective, metallic layer 19 is approximately 2 microns (ie. in the range of 0.5 to 3 microns).

The application of the metallic layer 19 will define the spacer 18 configuration. The spacers 18 can be in the form of pillars or panes, or other configurations. The aluminum reflective layer 19 is preferably deposited through a mask. Alternatively, the reflective layer 19 can be blanket deposited, and then photomasked to form the desired pattern. The area covered by the reflective metal 19 represents the cross-section of the spacer support 18. The preferred width of a spacer support 18 is in the approximate range of 5-25 microns. The high aspect ratio support structures 18 preferably have a height to width aspect ratio of 5:1 or more.

The plate 21 is then preferably placed in a vacuum, and a laser beam is directed toward it. Those areas of the chemical polymer layer 18' covered by the reflective material 19 remain intact, as shown in FIG. 3. However, those areas representing only the polyimide insulator material 18' will be "ablated" or vaporized away upon irradiation by the laser. The laser energy impacts the insulative layer 18', and heats the polyimide to a point at which it is vaporized (i.e. ablates).

An alternative embodiment involves optionally depositing a highly thermally conductive insulative layer (not shown) superjacent said highly reflective layer 19. An example of such a highly thermally conductive material is aluminum nitride. The thermally conductive layer affords protection to the reflective layer 19 during ablation process. After the irradiation, the aluminum nitride can be removed with a hydrogen sulfide etch, for example.

U.S. Pat. No. 4,749,840 entitled, "Intense Laser Irradiation Using Reflective Optics," discusses laser technology. Ablative photodecomposition (ADP) is a phenomenon observed at the surface, for example, of an organic polymer chemical compound (this includes many photoresist materials) to which far-ultraviolet laser pulses are directed, for which the fluence of a pulse exceeds a threshold. At low far-ultraviolet light intensity, such as from a mercury lamp, material may be oxidized at a significant rate from the irradiated area of the surface in the presence of air or oxygen. At higher far-ultraviolet light intensity, such as produced by a far-ultraviolet laser, the ADP process becomes operative at the surface. Thus, for purpose of the present application, radiant energy and high energy refer to that level of energy required to accomplish the ablative photodecomposition (ADP).

The ADP process leads to the spontaneous removal of material from the irradiated area. A suitable source of far-ultraviolet laser pulses is the argon-fluoride (ArFl) excimer laser, which produces radiation at approximately 193 nanometers (193 nm). This laser typically produces pulses up to a few hundred millijoules per square centimeter ($mJ/cm^2$) at a repetition rate up to several hundred per second, and the intensity of the pulses are (for practical purposes) invariant over many thousands of pulses. Any of the polymer chemical compounds such as polycarbonate, polyimide, polyethylene terephthalate, and polymethyl methacrylate (PMMA), can be etched by far-ultraviolet laser pulses of fluence exceeding a threshold of about $50mJ/cm^2$ by the ADP process.

According to the ADP process, the energy of a far-ultraviolet photon is sufficient to exceed the bond dissociation energy of the chemical bonds. That is the case for 193 nm far-ultraviolet radiation. Beyond that, the excess energy of the photon above the bond dissociation energy resides in the dissociated material fragments as translational, rotational and vibrational energy. As a result, the products of ablative photodecomposition are ejected from the surface of the film or "ablate." It is estimated that the material transports out of the irradiated area in about ten nanoseconds, and so as a result there is very little or no heating of the substrate.

The efficiency with which ablated material is transported from the original surface site is apparently related to the energy differential between the fluence per pulse and the ablation threshold. Clearly, the depth of etching per pulse is a function of the fluence of the pulse and has been found to be logarithmically dependent on the intensity.

The features of the reaction that define it as ablative photodecomposition are that the material ablates without damaging (minimal damage) any of the remainder of the sample, the average velocity of the ablated material particles is 1000 to 2000 meters per second away from the surface, the angular speed is within 25 to 30 degrees of normal and peaks in a direction normal to the surface, and the material ablates layer by layer as successive pulses of the far-ultraviolet radiation are directed to it.

The result of this ablation process is a very clean hole on the material, leaving behind a well-defined pit, of which the sides are straight and essentially normal to the surface and the bottom is flat and essentially parallel to the surface, and each pulse removes about the same depth of the pit (or etch by radiation) can be rather precisely controlled by metering the intensity and the number of the pulses.

The chemical polymer material will typically ablate completely in the exposed areas. However, should any debris remain, it can be removed through ultrasonic vibration in a fluid bath, using for example, water. Another option is to remove the debris with a jet of nitrogen or other gas, or air, thereby blowing it away.

At this point in the process, (see FIG. 4) the reflective layer 19 is preferably removed by any of the known methods in the art, for example etching. The remaining polyimide structures 18' will function as the spacer supports 18. However, the reflective layer 19 need not be removed, but can remain on the spacers 18. The materials used to form the reflective layer 19, are often conductive, however the material from which the spacer 18 is formed is non-conductive, hence there will not be a problem of electrical breakdown if the reflective layer 19 is not removed.

An alternative embodiment employs the laser to "scribe" the unwanted material away, leaving the spacers 18 behind. "U.S. Pat. Nos. 4,292,092 and 4,892,592 disclose one suitable laser scribing technique, although certainly not the only suitable technique. Scribing can be performed either by moving the beam of the laser with respect to the substrate or by mounting the substrate on an X-Y table that is movable with respect to the beam of the laser. Scribing is preferably done from the front, but can be done from the back, as well. However, if done from the back, the laser energy may have to penetrate other layers of material or structures already formed on the electrode plate 16 or 21. Insulative layer 18' is then scribed with a laser to ablate the polyimide along a predetermined pattern of lines.

In such an alternative, it may not be necessary to deposit a reflective coating layer 19 as the laser can be programmed to make accurate sweeps across the plate 21 to eliminate that area of polyimide 18' which will not form the spacers 18.

A further embodiment involves the deposition of a selectively etchable material layer (not shown). Such a layer can be polyimide, silicon nitride, or other suitable material. A laser is used to ablate holes in the material layer at the sites where spacers 18 are desired, thereby creating a mold. The holes are then filled with a spacer forming material, such as polyimide or silicon nitride. The excess of this material extending beyond the mold can be removed through chemical mechanical polishing (CMP). The selectively etchable material can then be removed by any of the methods known in the art, thereby leaving the spacers 18.

A process for constructing spacers for use in flat panel displays is described in U.S. patent application Ser. No. 851,036, Mar. 12, 1992, entitled METHOD TO FORM HIGH ASPECT RATION SUPPORTS (SPACERS) FOR FIELD EMISSION DISPLAY USING MICRO-SAW TECHNOLOGY, having the same assignee as the present application. It describes a mold creating process similar to that which is described in the preceding paragraph. However, a micro-saw rather than a laser is used to create the mold. Both methods have a great deal of merit, and offer flexibility to the manufacturer of spacers for flat panel devices. The above cited application is hereby incorporated by reference herein.

After the spacers 18 are formed, preferably on the baseplate 21, (i.e., the cathode) the cathodoluminescent screen 16 and the baseplate 21 are correctly aligned and fit together. Since the supports 18 are fabricated on one of the plates, the alignment step is easier than it would be if, as in other devices, the spacer supports were made separately and subsequently attached to both the baseplate 21 and the screen 16.

Once the plates have been properly aligned, they can be sealed by a method known in the art, for example, with a frit seal, and a vacuum created in the space between them. The vacuum is required to prevent Paschen breakdown in the space between the electrodes, i.e., the emitter tips 13 and the cathodoluminescent screen 16.

As previously mentioned, the silicon nitride or polyimide spacers 18 which have been fabricated can tolerate high temperature bakeout, of about 400° C. which is necessary for the creation of the vacuum.

All of the U.S. Patents cited herein are hereby incorporated by reference herein as if set forth in their entirety.

While the particular process as herein shown and disclosed in detail is fully capable of obtaining their objects and advantages herein before stated, it is to be understood that it is merely illustrative of the presently preferred embodiments of the invention and that no limitations are intended to the details of construction or design herein shown other than as described in the appended claims. The present invention is equally applicable to other flat panel display device requiring spacer structures. Further, it can be appreciated by one skilled in the art that other wavelengths of laser energy at various power levels can be used in the irradiation step to accomplish that which has been herein disclosed.

We claim:

1. A process for the formation of interelectrode support structures, said process comprising the following steps:
    depositing a first material on a substrate, said substrate being disposed on a first electrode plate;
    selectively exposing said first material to radiant energy to define the support structures;
    attaching and sealing said first electrode plate to a second electrode plate; and
    creating a vacuum between said first electrode plate and said second electrode plate.

2. The process according to claim 1, wherein said radiant energy ablates said first material upon which said radiant energy impinges.

3. The process according to claim 2, further comprising the step of depositing a radiation reflective layer superjacent said first material, said radiation reflective layer having a pattern, whereby said radiation reflective layer reflects said radiant energy.

4. The process according to claim 3, further comprising the step of removing said radiation reflective layer subsequent to exposing said first material to said radiant energy.

5. The process according to claim 4, wherein said radiation reflective layer has a depth of approximately 0.5 to 3 microns.

6. The process according to claim 2, wherein said radiant energy is directed toward said first material in a preselected plan.

7. The process according to claim 2, wherein said first material is deposited in sites where the support structures are to be formed.

8. The process according to claim 7, wherein said radiant energy is selectively directed to ablate said first material proximate to said sites where the support structures are to be formed.

9. The process according to claim 2, wherein said first material has an approximate depth of 50 to 1000 microns.

10. The process according to claim 9, wherein said radiant energy has a wavelength, said wavelength being far-ultraviolet.

11. The process according to claim 10, wherein said radiant energy is pulsed from a laser.

12. The process according to claim 11, wherein
    said first material is at least one of a dielectric, a chemical polymer, and an insulator, and
    said chemical polymer is at least one of polyimide, and silicon nitride.

13. The process according to claim 12, further comprising the steps of:
    applying a second material through said first material where said radiant energy defined the support structures, said second material being selectively etchable with respect to said first material, wherein said first material functions as a mold and said second material forms said support structures;
    planarizing said second material equal to said depth of said first material, wherein said second material is planarized by chemical mechanical polishing (CMP); and
    removing said first material, thereby exposing said support structures.

14. A process for the formation of interelectrode support structures, said process comprising the following steps:
    applying a first material to a substrate, said substrate being disposed on a first electrode plate;
    wherein said first material is used to form said support structures;
    applying a radiation reflective material superjacent said support forming material thereby defining a pattern, whereby said radiation reflective material reflects energy at a predetermined wavelength;
    exposing said first material to laser energy at said predetermined wavelength; removing said radiation reflective layer;
    attaching and sealing said first electrode plate to a second electrode plate; and
    creating a vacuum between said first electrode plate and said second electrode plate.

15. The process according to claim 14, wherein said laser energy wavelength is far-ultraviolet.

16. The process according to claim 15, wherein said laser energy ablates said support forming material upon which said laser energy impinges.

17. The process according to claim 16, wherein a highly thermally conductive layer is deposited superjacent said highly reflective layer.

18. The process according to claim 17, wherein said highly thermally conductive layer is aluminum nitride.

19. An interelectrode support structure, formed by:
depositing a first material on an electrode plate, said first material being used to form said support structures;
selectively depositing a highly reflective material superjacent said first material, said highly reflective material defining a cross-section of said support structures, said cross-section being less than 50 μm by 50 μm;
exposing said electrode plate to pulses of radiant energy, said radiant energy reflecting off said highly reflective material and ablating said first material upon which said highly reflective material was not deposited; and
removing said highly reflective material, thereby exposing the first material which forms said support structures.

20. The interelectrode support structure of claim 19, wherein said radiant energy has a wavelength, said wavelength being approximately 193 nm.

21. The process according to claim 1, further comprising the step of:
removing said substrate around the support structures, thereby exposing said first electrode plate.

22. The process according to claim 14, further comprising the step of:
removing said substrate around said support structures, thereby exposing said first electrode plate.

* * * * *